United States Patent [19]

McNutt

[11] Patent Number: 4,852,063

[45] Date of Patent: Jul. 25, 1989

[54] PROGRAMMABLE VOLTAGE OFFSET CIRCUIT

[75] Inventor: Michael J. McNutt, El Toro, Calif.

[73] Assignee: Ford Aerospace & Communications Corporation, Newport Beach, Calif.

[21] Appl. No.: 255,237

[22] Filed: Oct. 11, 1988

Related U.S. Application Data

[62] Division of Ser. No. 124,531, Nov. 23, 1987, Pat. No. 4,829,459.

[51] Int. Cl.[4] .............................................. G11C 11/34

[52] U.S. Cl. ...................................... 365/185; 365/226

[58] Field of Search ................. 365/185, 94, 189, 226; 357/23

[56] References Cited

U.S. PATENT DOCUMENTS

| | | | |
|---|---|---|---|
| 4,361,847 | 11/1982 | Harari | 357/23.5 |
| 4,458,348 | 7/1984 | Fukuda et al. | 365/185 |
| 4,541,073 | 9/1985 | Brice et al. | 365/185 |
| 4,780,750 | 10/1988 | Nolan et al. | 365/185 |

*Primary Examiner*—Terrell W. Fears
*Assistant Examiner*—Melissa J. Koval
*Attorney, Agent, or Firm*—Edward J. Radlo; Keith L. Zerschling

[57] ABSTRACT

A programmable voltage offset circuit (PVOC) (1) comprises a temporary latch memory (7); a latch disable circuit (5) which selects that PVOC (1) among several such circuits which may be simultaneously present on the same semiconductor chip; a resistor array (3); and a programmable nonvolatile memory (37). The desired voltage offsets V(OFFSET)s are temporarily produced in an iterative manner using the latch memory (7). Quasi-permanent voltage offsets V(OFFSET)s are then programmed using the nonvolatile memories (37), each of which typically comprises an EPROM (39). Application of an avalanche voltage V(STORE) to a PFET (43) portion of the EPROM (39) causes the PFET (43) to avalanche, thereby selectively programming the nonvolatile memory (37), depending upon the status of a signal supplied from the latch memory (7).

4 Claims, 3 Drawing Sheets

PROGRAMMABLE VOLTAGE OFFSET CIRCUIT

This is a divisional application of application Ser. No. 124,531, filed Nov. 23, 1987, now U.S. Pat. No. 4,829,459.

DESCRIPTION

1. Technical Field

This invention pertains to the field of simultaneously producing several offset voltages that may be used to correct an analog circuit, such as the output of a CCD (charge coupled device).

2. Background Art

U.S. Pat. No. 4,245,165 discloses an analog programming device that is more difficult to program than the present invention. The reference requires thin gate oxides that allow electrons to tunnel in and out a floating gate. This is not compatible with most silicon wafer processes used for signal processing and logic, such as CMOS (complimentary metal oxide semiconductor). The high voltages required for programming cannot be selectively switched to control multiple adjustments without CMOS-process-incompatible high voltage logic. On the other hand, the programmable voltage offset circuit of the present invention can be made using CMOS and can be fabricated on the same chip as the circuit it controls.

This reference further differs from the present invention in that: (1) It uses analog, not digital, components; therefore, it is subject to drifting, is hard to program accurately, and is not readily reproducible. (2) The programming is not readily reversible. (3) No two-step programming is disclosed. The present invention uses initial temporary iterative latch memory programming followed by quasi-permanent nonvolatile memory programming.

U.S. Pat. No. 4,573,144 discloses a means for selecting multiple programming elements, in which an EPROM (erasable programmable read only memory) is programmed by placing a control voltage at the EPROM output via a FET (field effect transistor). This reference differs from the present invention in that:

(1) It does not disclose a two step programming process, whereas the present invention features initial iterative temporary programming followed by quasi-permanent nonvolatile memory programming. (2) The programmable element has fixed gates as well as a floating gate. This two-level gate structure is more complex and expensive than that of the EPROM's used in the present invention. (3) The reference inhibits avalanching by using leakage current, whereas the present invention inhibits avalanching by affirmatively placing a CMOS control signal of zero volts or 5 volts at the output of the EPROM.

U.S. Pat. No. 3,721,838 discloses a specialized programmable device for replacing defective elements in a monolithic device.

U.S. Pat. No. 4,050,030 discloses a specialized circuit for reducing temperature sensitivity in a differential amplifier, wherein the offset adjustment is controlled by external resistors.

U.S. Pat. No. 4,412, 241 discloses an extension of a fusible link, in which the programming is irreversible and requires large currents. The reproducibility and reliability of this programming technique are below par. *IBM Technical Disclosure Bulletin* Volume 19, No. 8, January 1977, pages 3089–3090 also discloses a fusible link device.

DISCLOSURE OF INVENTION

The present invention is an apparatus for producing offset voltages V(OFFSET). Several programmable voltage offset circuits (PVOC's) (1) may be used simultaneously to produce one V(OFFSET) each. Each PVOC (1) comprises a digital latch memory (7); coupled to an input of the latch memory (7), a latch disable circuit (5); coupled to an output of the latch memory (7), a resistor array (3) which outputs the voltage offset V(OFFSET); and associated with the resistor array (3), a programmable nonvolatile memory (37). The desired voltage offsets V(OFFSET) are initially produced using the latch memories (7). More permanent V(OFFSET)s are subsequently programmed using the nonvolatile memories (37).

Preferably, the programmable nonvolatile memory (37) consists solely of CMOS circuitry, and comprises an EPROM (39) having an NFET (41) and a PFET (43) whose drains are connected together to form an EPROM output (45), and a single (floating) gate (57) associated with both the NFET (41) and the PFET (43). An avalanche voltage V(STORE) power supply is associated with the PFET (43). A CMOS control signal is applied to the EPROM output (45). Activation of the avalanche voltage from V(STORE) to the PFET (43) causes the PFET (43) to avalanche, thereby programming the nonvolatile memory (37), depending upon the status of the CMOS control signal.

BRIEF DESCRIPTION OF THE DRAWINGS

These and other more detailed and specific objects and features of the present invention are more fully disclosed in the following specification, reference being had to the accompanying drawings, in which.

BEST MODE FOR CARRYING OUT THE INVENTION

Analog circuits are particularly sensitive to the normal variations that occur in wafer fabrication. These variations produce changes in offset voltages that make each device unique and non-interchangeable. In the special case where the analog circuit is a CCD (charge coupled device) such as CCD 17 of FIG. 1, this feature requires the use of externally tuned DC inputs to match each device to the surrounding system. This results in unwanted system size and complexity.

In the present invention, the offset tuning function is integrated on the same analog chip as CCD 17. The tuning information is stored in nonvolatile memory 37 on the same chip. Then each CCD 17, which has at least one output 19, appears identical to the system user.

Figure 1:
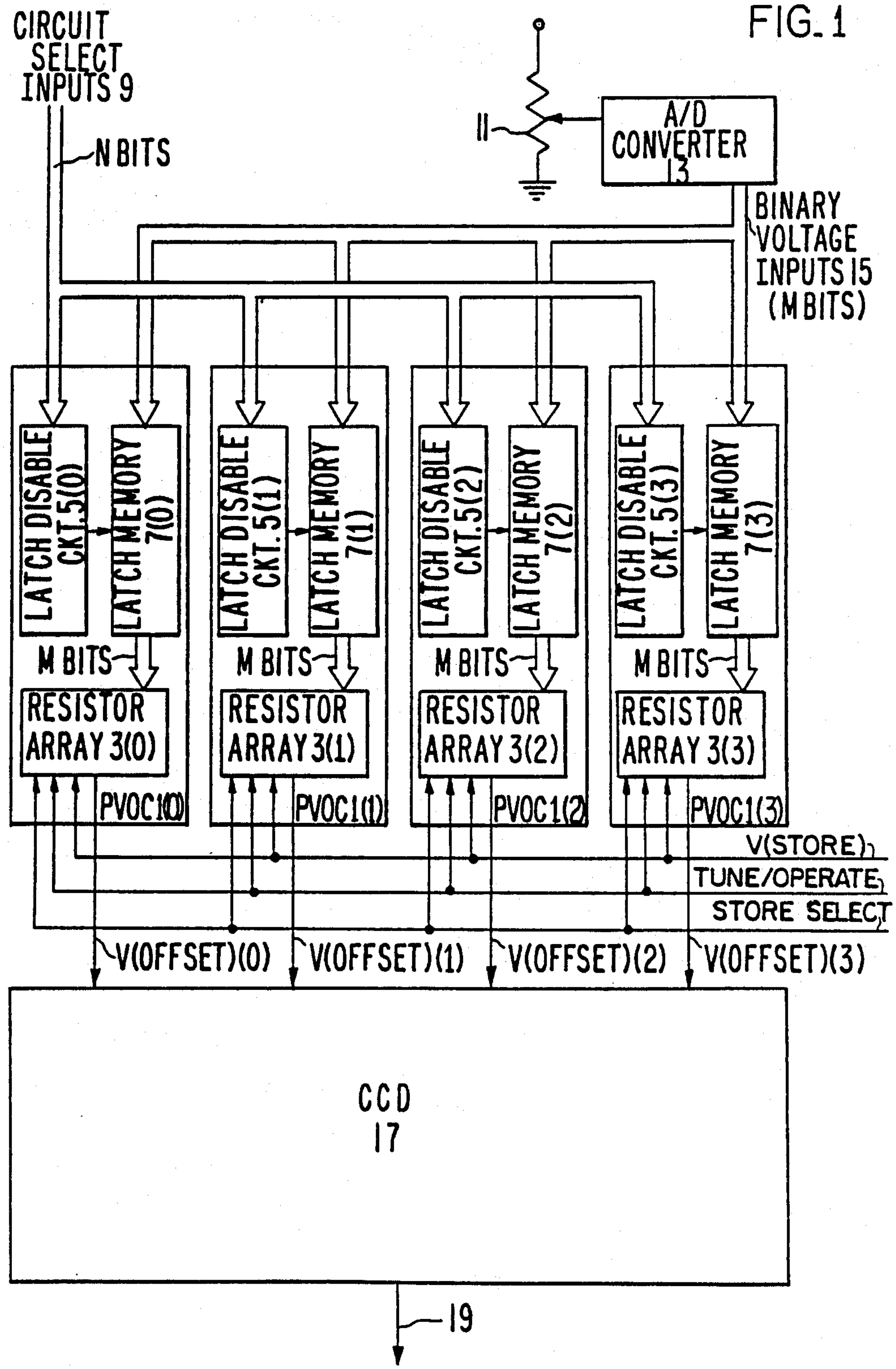
FIG. 1 is a block diagram of a circuit in which four programmable voltage offset circuits (PVOC's) 1 of the present invention are used to correct a CCD 17.

In the embodiment of the invention illustrated in FIG. 1, four voltage offsets V(OFFSET)s are used to correct CCD 17. Thus, four programmable voltage offset circuits (PVOC's) 1 are used. In general, $2^N$ PVOC's 1 are used (where N is arbitrarily high) and are controlled by N bits of circuit select input information 9. The V(OFFSET)s tune the clocking, input, and output functions of the CCD 17. Pixel correction, although not typically performed, might be practical for small arrays 17.

Instead of CCDs 17, the present invention can be used to offset operational amplifiers, analog-to-digital converters, or any other analog devices.

Each PVOC 1 can be built using CMOS technology to minimize power drain. In this case, all the components within PVOC 1, including nonvolatile memory 37, are built using CMOS. This is compatible with current CCD 17 and other analog processing technology.

Regardless of the number of PVOC's 1 that are present, the voltages desired to be programmed into the PVOC's 1 can be generated by a single circuit comprising potentiometer 11 and analog-to-digital converter 13. These latter two components are not integrated onto the same chip as CCD 17 and the other components of the instant invention; they are used only in the initial temporary iterative tuning procedure and are not needed in the final operating mode. They provide a set of binary voltage inputs 15 to the PVOC's 1 that determine the ultimate offset voltages V(OFFSET)s. Input signal 15 occupies M bits, where M is a function of the desired resolution. The dial on potentiometer 11 determines the analog version of the desired iterative V(OFFSET)s.

Only one of the PVOC's 1 is programmed at one time, as determined by the N bit circuit select input signal 9, in the initial temporary iterative programming mode. In the illustrated embodiment, in which there are four PVOC's 1, the circuit select input signal 9 has two bits, which are simultaneously fed to a latch disable circuit 5 within each PVOC 1. For the chosen PVOC 1, the latch disable circuit 5 for that PVOC outputs a logical 1 signal to the associated latch memory 7, which unlatches the contents of that latch memory 7, i.e., the output of A/D converter 13 is fed to the resistor array 3 for that PVOC 1. Whenever a logical 1 is not provided from the latch disable circuit 5 to the latch memory 7, the contents of latch memory 7 are latched (saved), regardless of the status of signal 15.

Thus, one set of latch memory 7 contents is freed at a time for tuning. Tuning of the four V(OFFSET)s can then be iterative, with each V(OFFSET) being retuned in any order after other V(OFFSET)s are tuned. It is not necessary to know in advance what each V(OFFSET) should be; the iterative process can be trial and error. This allows for the common situation in which the optimal V(OFFSET)s are dependent upon each other.

Each latch memory 7 can be any temporary storage medium, e.g., a set of flip-flops.

Figure 2:
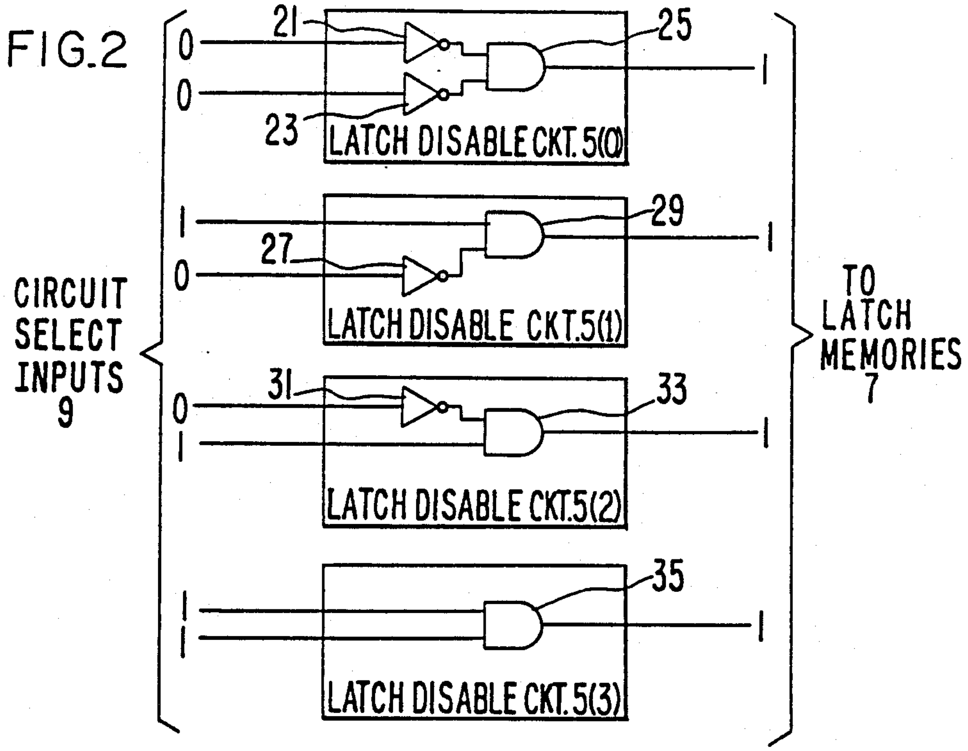
FIG. 2 is a set of four circuit diagrams for the four latch disable circuits 5 which generate four disable codes used in the embodiment of the invention described in FIG. 1.

FIG. 2 illustrates four configurations which can be used for the four latch disable circuits 5. The numbers in parentheses refer to the particular PVOC 1.

The uppermost circuit, circuit 5(0), outputs a logical 1 in response to an input 9 binary address of 0,0. This circuit comprises two inverters 21,23 each coupled to an input of AND gate 25.

Latch disable circuit 5(1) outputs a logical 1 in response to an input 9 binary address of 1,0. This circuit comprises a single inverter 27 coupled to the $2^0$ position of the input signal 9. Inverter 27 is coupled to an input of AND gate 29.

Latch disable circuit 5(2) outputs a logical 1 in response to an input 9 binary address of 0,1. In this circuit, a single inverter 31 is coupled to the $2^1$ position of input signal 9. The output of inverter 31 is coupled to an input of AND gate 33.

Latch disable circuit 5(3) comprises a single AND gate 35, which outputs a logical 1 in response to a binary input of 1,1.

Figure 3:
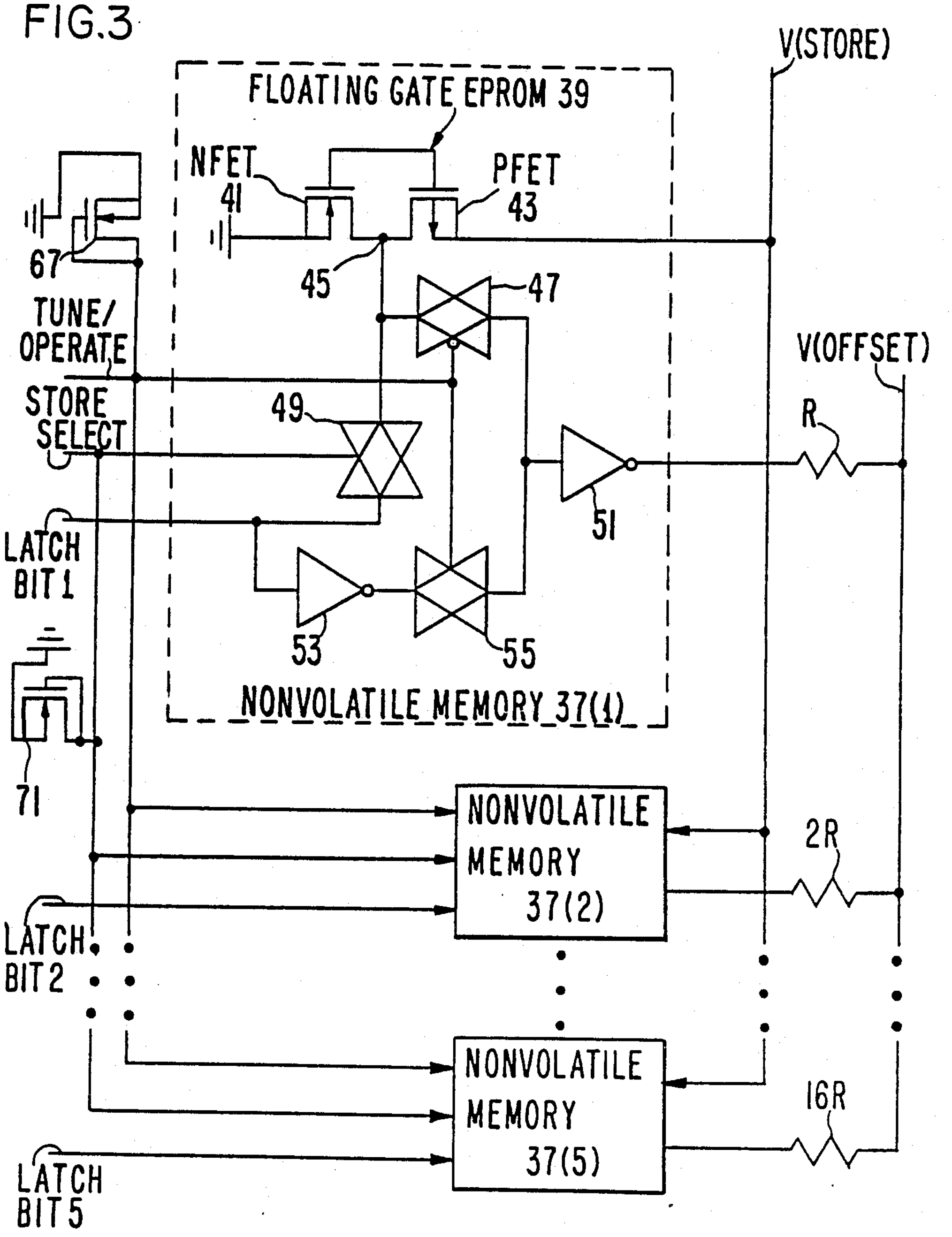
FIG. 3 is a partial block, partial circuit diagram of resistor array 3 of the embodiment illustrated in FIG. 1.

The actual V(OFFSET) for each PVOC 1 is produced by means of a set of M resistors whose values form a binary progression. M is arbitrarily high, and controls the desired amount of resolution. In FIG. 3, M is illustrated to be 5. The five resistors have values of R, 2R, 4R, 8R, and 16R, respectively. Each resistor in the array 3 is switched by the corresponding one of five bits from latch memory 7 to either 0 volts or the power supply voltage applied to each of the inverting buffers 51. If the output of each inverting buffer 51 is zero, V(OFFSET) is zero. If the output of all the inverting buffers 51 is five volts, V(OFFSET) is five volts. The inverting buffers 51 can have a power supply voltage different from normal CMOS (in which a logical zero is zero volts and a logical one is 5 volts), e.g., 10 volts, in order to enable the product of a higher V(OFFSET). Each buffer 51 has unity voltage gain and positive current gain.

Thus, the range of possible V(OFFSET)s is equal to the voltage of the (common) power supply for the five inverting buffers 51. The resolution by V(OFFSET) is this power supply voltage divided by $2^M$. For the illustrated five resistor array with a 5 volt power supply, the tuning range is therefore 5 volts and the resolution is $5/2^5$ equals 0.156 volts. Improved resolution over a narrower range can be provided by adding an extra unswitched resistor. A sixth resistor of ½ the value of the previous smallest resistor (corresponding to the most significant bit of digital information from latch memory 7) would make the resolution 0.078 volts from 0 to 2.5 volts (in the case where the sixth resistor is connected to zero volts) or from 2.5 volts to 5.0 volts (in the case where the sixth resistor is connected to 5 volts). More or fewer switched resistors can be similarly used to fit the particular application.

In addition to the resistors themselves, each resistor array 3 contains a nonvolatile memory 37. The voltage switched to inverting buffer 51 and then to the resistor is controlled by the output from latch memory 7 during the initial temporary iterative programming ("tune") mode.

Then, during a "store" mode, the nonvolatile memories 37 are programmed. the store mode is entered via the "store select" input line, which is coupled to each nonvolatile memory 37 of each PVOC 1.

Then, during the operating mode, control is switched between the latch memory 7 and the nonvolatile memory 37 by the tune/operate input line, which is connected to the nonvolatile memory 37 of each PVOC 1, specifically, to transmission gate switches 47 and 55. A tune condition is indicated on the tune/operate line by a logical 1 and an operate by a logical 0. Thus, during tune mode, gate 47 is switched off because an inverter precedes it. This inhibits the EPROM output 45 from reaching the input of inverting buffer 51. During tune mode, gate 55 is open (switched on), which enables the latch bit emanating from the corresponding bit position of latch memory 7 (after inversion by inverter 53) to be presented to the input of inverting buffer 51, which again inverts the bit for presentation to the resistor.

During the operate mode, the tune/operate line is a logical 0, which closes transmission gate 55 and opens transmission gate 47, enabling EPROM output 45 (which is the inverted value of the latch bit just prior to EPROM 39 programming, as will be elaborated upon, infra) to be placed at the input of inverting buffer 51.

Pull down transistor 67, which is fabricated on the same chip as the other components, is a N-type transistor that sets the tune/operate line to 0 volts in the operate mode when no input is applied. This eliminates the need for an input during normal operation.

EPROM 39 is preferably a standard CMOS inverter with a floating gate 57 fabricated of polysilicon (see FIG. 4) and a power supply V(STORE) that can be ramped up to 30 volts. Alternatively, EPROM 39 can be fabricated in MNOS (metal nitride oxide semiconductor) material. A singe V(STORE) is coupled to each EPROM 39 of each PVOC 1, which enables simultaneous programming of all the EPROMs 39 in the system. EPROM 39 further comprises an NFET (N-type field effect transistor) 41 and a PFET (P-type field effect transistor) 43. NFET 41 and PFET 43 have their drains coupled together to form EPROM output 45.

After wafer processing, NFET 41 is normally on and PFET 43 is normally off. This can be insured by eliminating the threshold adjust implant in EPROM 39. This implant is used to increase the NFET 41 threshold voltage and decrease the PFET 43 threshold voltage. NFET 41 can then be turned off and PFET 43 turned on by avalanche injection, which is the method used to quasi-permanently program EPROM 39 in the store mode.

Figure 4:
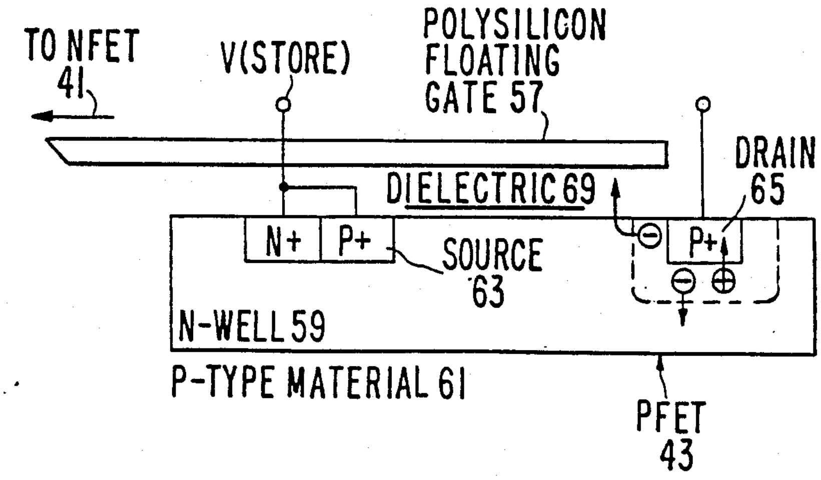
FIG. 4 is a conceptual cross-section illustrating PFET 43 used in the present invention.

The avalanche mechanism is performed on PFET 43 as illustrated in FIG. 4. PFET 43 is in an N-well 59 that is coupled to the positive power supply voltage V(STORE) via source 63. If drain 65 is at ground potential and V(STORE) is temporarily ramped to approximately 30 volts, the drain 65 junction avalanches due to the high field and generates hot electrons and holes. The hot carriers have enough energy to surmount the energy barrier at the interface comprising silicon substrate 59 and silicon dioxide dielectric 69; these hot carriers then diffuse through the dielectric 69. The holes are very poor diffusers in silicon dioxide 69, while the electrons diffuse readily, and the drain 65 junction field helps separate the holes and electrons. The polysilicon floating gate 57 charges up with sufficient electrons to turn on PFET 43 and turn off NFET 41. The floating gate 57 can remain thus charged for many years under reasonable operating conditions.

This is a quasi-permanent type of programming. However, it is not permanent, because EPROM 39 can be erased by applying intense ultraviolet radiation that provides enough energy to allow the trapped electrons to diffuse back over the barrier to silicon substrate 59.

Referring back to FIG. 3, EPROM 39 programming is accomplished after the initial iterative tune mode by commanding the store select line to be high, which opens transmission gate 39, thereby coupling the appropriate latch bit from latch memory 7 to EPROM output 45. The signal on the latch bit line has sufficient current so that it overdrives NFET 41. This is done so that when one enters the store mode, the latch output will predominate over NFET 41.

V(STORE) is then temporarily ramped to the normal avalanche voltage of 30 volts. If the latch output is low, EPROM output 45, which is also PFET drain 65, sees the entire 30 volts and avalanches. This turns on PFET 43, turns off NFET 41, and stores a logical 1 in EPROM 39. Thus, the inverse of the latch bit appears at EPROM output 45, which is inverted a second time by inverting buffer 51 during the operate mode (when transmission gate 47 is open).

If, on the other hand, the latch output is high, 5 volts is applied to EPROM output 45. In this case, the PFET drain 65 junction does not see the entire avalanche voltage of 30 volts, but rather sees only 25 volts. Thus, avalanching is suppressed, and EPROM 39 retains its logical 0 output, which is inverted by inverting buffer 51 during the operate mode.

The input of inverting buffer 51 is the same before and after the store mode, so V(OFFSET) does not vary.

When V(STORE) is returned on its normal value (5 volts), EPROM 39 functions as a simple nonvolatile memory cell. V(STORE) can be intermittently shut off, but as soon as it is restored, EPROM 39 will correctly switch the inverting buffer 51 to restore the appropriate V(OFFSET). This assumes that the (common) power supply of the inverting buffers 51 consistently returns to its same level. V(OFFSET) is relatively insensitive to minor variations in the voltages of the power supplies to EPROM 39 and the other circuitry, but relatively sensitive to the power supply voltage applied to the inverting buffers 51.

Store select is normally 0 volts. Pull down transistor 71 on the store select line insures that the transmission gate 49 is off if the input to store select is disconnected. Thus, no store select input is required after the store operation has been completed.

The channel resistance of each inverting buffer 51 should be considerably smaller than the value of the resistance it is driving. This makes small changes in the input to inverting buffer 51 inconsequential to the voltage switched to the resistor.

The invention described above offers the following advantages:

It is compatible with most VLSI CMOS process technology. If low power is not needed, it can also be built in NMOS or PMOS technology.

Each critical offset voltage V(OFFSET) can be individually tuned over a wide range.

The tuning process is iterative. Each V(OFFSET) can be tuned and retuned in any order using the temporary latch memories 7. This is an important advantage over the use of fusible links.

The outputs from the latch memories 7 are simultaneously automatically stored in the EPROM's 39 during the store operation in parallel rather than serially. Thus, after the initial temporary iterative programming has been completed, a single push button connected to the common store select line and V(STORE) can implement EPROM 39 programming for all the PVOC's 1. Because the avalanche voltage V(STORE) is directly applied to all EPROM's 39 simultaneously, no high voltage selection circuits have to be designed and built.

In case of programming errors, an EPROM 39 can be erased in ultraviolet light and reprogrammed. For particularly sensitive applications, the device can be programmed, burned in, erased, using ultraviolet light, reprogrammed, and then shipped.

The V(OFFSET) produced via the temporary latch 7 is identical to that produced by EPROM 39, because in both cases the inverting buffers 51 and resistors are the same. Thus, linearity in resistor array 3 is not required.

The final EPROM 39-stored V(OFFSET) is the same as the one that was generated during the initial temporary iterative programming.

By integrating all offset tuning on one chip and programming it into nonvolatile memory 37, each analog chip is identical to all others of the same type. Thus, analog circuits such as CCDs 17 take on the uniformity of digital circuits. Direct interchangeability is allowed without sophisticated adjustment or compensation. All external tuning is eliminated.

PVOC 1 can be operated in an automatic mode, in which case the tune/operate line is kept in the tune position. The latch 7 outputs are changed automatically in real-time by software. In this automatic mode, EPROM 39-stored values could be used to provide an initial V(OFFSET) when power is turned on.

In its CMOS configuration, PVOC 1 is fairly static and draws only leakage current plus the current to the resistors. Most loads to which V(OFFSET) is applied will be purely capacitive, so the resistors can be sized in the megohm range. Therefore, the total power draw for one 5-bit PVOC 1 at 15 volts is about 250 microwatts.

A 5-bit PVOC 1 uses only about 500 square microns of chip area in three micron CMOS technology. This is about $2.5\times10^{-3}$ cm$^2$, so even 10 of these circuits 1 are not a severe area burden, given today's chip areas approaching a square centimeter.

Implementation of PVOC 1 requires M inputs 15 for M-bit voltage resolution, N inputs 9 for selecting each of the $2^N$ offsets to be programmed, a V(STORE) avalanche power supply, two control inputs, and the power supply for inverting buffers 51. However, all DC offset inputs of the prior art are eliminated, and only the power supply for inverting buffers 51 is used during normal operation in the operating mode. Even that input could share the analog power supply of CCD 17. If the temporary programming is done at the wafer probe test level, the package pinout can actually be less than for circuits using external offset compensation.

The circuitry can easily be used with automated programming if a single parameter is to be optimized by the offset adjustments V(OFFSET). This programming can be part of the functional test prior to shipping.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention. For example, the concepts of the invention are easily adaptable to gain and time constant programming, i.e., a variable resistor rather than a voltage offset is programmed. In that case, each inverting buffer 51 is replaced by a transmission gate. Then a bank of parallel resistors with binary values is switched in or out of the circuit. The resulting variable resistor could be the feedback resistor in an operational amplifier, controlling gain, or the resistor in a resistive/capacitive time constant, controlling the time constant (delay, bandwidth).

What is claimed is:

1. A programmable nonvolatile memory consisting solely of CMOS circuitry and comprising:

an EPROM having an NFET and a PFET whose drains are connected together to form an EPROM output, and a single floating gate associated with both the NFET and the PFET;

means for applying an avalanche voltage to the PFET; and means for applying a CMOS control signal to the EPROM output; wherein activation of the avalanche voltage applying means to the PFET selectively causes the PFET to avalanche, thereby programming the nonvolatile memory, depending upon the status of the CMOS control signal.

2. The memory of claim 1 wherein:

the NFET has a source coupled to ground;

the PFET has a source coupled to the avalanche voltage applying means; and the CMOS control signal has a significantly greater current than that produced by the NFET, so that when the NFET is switched on, the CMOS control signal predominates over the signal produced by the NFET at the EPROM output.

3. The memory of claim 1 wherein the CMOS control signal can be zero volts (representing a binary zero) and a positive voltage (representing a binary one);

when the CMOS control signal is zero volts, activation of the avalanche voltage applying means causes the PFET to avalanche, thereby programming the EPROM; and when the CMOS control signal is a positive voltage, activation of the avalanche voltage applying means does not result in avalanching of the PFET, thereby inhibiting programming of the EPROM.

4. The memory of claim 1 further comprising:

a temporary latch memory that provides the CMOS control signal to the EPROM output; and a resistive network coupled to the EPROM output and to the temporary latch memory, said resistive network producing an output voltage; wherein during an initial tune stage, the contents of the temporary latch memory are fed to the resistive network, and during a subsequent operating stage, the EPROM output is fed to the resistive network.

* * * * *